United States Patent [19]
Segars

[11] Patent Number: 5,610,927
[45] Date of Patent: Mar. 11, 1997

[54] INTEGRATED CIRCUIT CONTROL

[75] Inventor: Simon A. Segars, Cambridge, United Kingdom

[73] Assignee: Advanced Risc Machines Limited, Cambridge, United Kingdom

[21] Appl. No.: 667,330

[22] Filed: Jun. 20, 1996

Related U.S. Application Data

[63] Continuation of Ser. No. 303,538, Sep. 9, 1994, abandoned.

[30] Foreign Application Priority Data

Apr. 12, 1994 [GB] United Kingdom .................. 9407192

[51] Int. Cl.$^6$ .................................................. G01R 31/28
[52] U.S. Cl. ................ 371/22.3; 371/22.5; 371/25.1; 371/22.1; 371/24; 326/93; 326/16
[58] Field of Search ........................... 371/22.3, 22.4, 371/25.1, 22.1, 22.5; 307/480; 324/73 R

[56] References Cited

U.S. PATENT DOCUMENTS 4,945,536  7/1990  Hancu .................................. 371/22.3
5,001,713  3/1991  Whetsel .............................. 371/22.3
5,130,988  7/1992  Wilcox et al. ....................... 371/22.3
5,175,447  12/1992  Kawasaki et al. .................... 307/480

FOREIGN PATENT DOCUMENTS

0271910A2  6/1988  European Pat. Off. ..
WO84/02580  7/1984  WIPO .

*Primary Examiner*—Robert W. Beausoliel, Jr.
*Assistant Examiner*—Nadeem Iqbal
*Attorney, Agent, or Firm*—Albert C. Smith

[57] ABSTRACT

An integrated circuit is described having a scan chain of the JTAG type in which there are provided a plurality of serially connected test cells 2. The test cells serve the additional function of operating during the normal operation of the integrated circuit to store signal values that are logically combined (compared) with signal values generated by the integrated circuit to yield control signals into for controlling the operation of the integrated circuit. This allows the storage capacity of the test cells to be utilised during normal operation when they would otherwise be idle.

10 Claims, 14 Drawing Sheets

INTEGRATED CIRCUIT CONTROL

This is a continuation of U.S. application Ser. No. 08/303,538, filed on Sep. 9, 1994, now abandoned.

BACKGROUND OF THE INVENTION

1. Field of the Invention

This invention relates to the field of integrated circuits. More particularly, this invention relates to integrated circuits having a plurality of serially connected test cells for applying a test stimulus to an integrated circuit and for capturing a test response.

2. Description of the Prior Art

It is known to provide integrated circuits having a scan chain of test cells to examine the internal state of the integrated circuit and to test external logic. An example of such scan chains is the JTAG system described in the IEEE 1149.1 1990 specification.

A scan chain consists of a storage element (test cell) adjacent to each of an integrated circuit's inputs and outputs connected together like a shift register. These scan chains may be boundary scan chains arranged between an integrated circuit and its input/output pads, macrocell scan chains arranged around a macrocell within an integrated circuit or an internal scan chain associated with points within the core or other working circuitry of an integrated circuit. All three of these types of scan chain may be separately provided or a single scan chain may have elements of more than one type.

FIG. 1 of the accompanying drawings illustrates a boundary scan chain. Each JTAG style test cell 2 is disposed adjacent an associated input/output contact pad 4 to which mechanical connections to the integrated circuit package may be made. It will be appreciated that test cells 2 may be associated with points within the integrated circuit that are not directly associated with a contact pad 4 providing that the test cells 2 still form part of a serial scan chain.

Using this technique test stimulus data is serially loaded into the test cells 2 via a serial input 6. When this test stimulus data is in position it is applied to the appropriate points within the integrated circuit. The integrated circuit is then allowed to conduct one or more processing cycles following which the signal values at the points coupled to the test cells 2 are captured. These captured signal values are then serially clocked out from the scan chain via a serial output 8 for analysis. In this way, a test stimulus can be applied and the resulting output values captured and compared against expected results. This is a powerful technique for testing integrated circuits, particularly embedded macrocells where external access to all the signals is not available.

FIG. 2 of the accompanying drawings illustrates a test cell 2 (configured for an input line) in more detail. The serial data path passes through a serial input line 10, an input transmission gate 12, a first latch 14, an output transmission gate 16, a second latch 18 and a serial output line 20. The first latch 14 and the second latch 18 comprise inverting buffers using weak feedback followed by a further inverter to restore the signal polarity. The serial loading of data through the test cells operates by the use of separate clock signals for the input transmission gate 12 mad the output transmission gate 16. The input transmission gate 12 is enabled by an input clock signal shelf that occurs before a non-overlapping output clock signal shclk2 fed to the output transmission gate 16. In this way, a signal value from a preceding test cell 2 is first loaded into the first latch 14 via the serial input line 10 whilst the signal value that had been held by the test cell 2 under consideration is output from the second latch 18 to the succeeding test cell via the serial output line 20. After this transfer has occurred, the input transmission gates 12 are disabled and the output transmission gates 16 enabled to transfer the signal value from the first latch 14 to the second latch 18.

The data path to the integrated circuit in normal system operation, passes through a contact pad 4, a main path transmission gate 22 and an output line 24. A stimulate transmission gate 26 and a capture transmission gate 28 are also coupled to the output line 24. The stimulate transmission gate 26 acts in conjunction with the main path transmission gate 22 under control of a multiplexing signal muxctl to either apply the signal value at the contact pad 4 to the integrated circuit or the signal value currently output from the first latch 14. The capture transmission gate 28 acts under control of a capture signal capclk to apply the current signal on the output line 24 to the input of the first latch 14 where it is stored for subsequent serial output and analysis.

The above described stimulate and capture functions are only some of the uses of the JTAG system. The scan chain is conventionally only used during predetermined hardware test operations.

Another aspect of the development of systems incorporating integrated circuits is the design and development of computer programs. Computer programs inevitably contain errors that require a software developer to trace and fix. In order to assist the software developer in this task, it is usual to provide a breakpoint during the program execution whereby the programmer can establish a set of conditions under he wishes the execution of the program to stop so that the variables present at that time can be examined to determine how the program is functioning. An example of such breakpoints would be "stop when an instruction is fetched from a certain location", or "stop every time a branch occurs".

The identification and handling of such breakpoints by analysis of the address bus, the data bus or control signals is normally performed external to the integrated circuit itself. This is because the amount of logic required to perform the comparison is too large to be conveniently borne by the integrated circuit itself. Also, the external logic must perform the comparison at high speed, due to cross-chip delays and skew between the signals of differing buses.

In addition to the predetermined hardware test operation discussed above it is also desirable to study the hardware operation in a more dynamic manner when searching for particular hardware conditions that may be giving rise to problems.

SUMMARY OF THE INVENTION

An object of the invention is to address the abovementioned problems.

Viewed from one aspect this invention provides apparatus for processing data, said apparatus comprising:

(i) an integrated circuit;

(ii) a plurality of serially connected test cells, each test cell being coupled to a respective point within said integrated circuit and being operable in a test mode that exchanges a signal value with said point;

(iii) means for serially transferring signal values through said plurality of test cells; and (iv) at least one means for logically combining a signal value stored within a test cell with a signal value generated by said integrated circuit at said point coupled to said test cell to generate a control signal for controlling operation of said integrated circuit.

The invention recognises that the scan chain is present all the time within the integrated circuit and yet normally only operates duping hardware testing operations. Thus, under normal operating conditions, there are potentially hundreds of test cells standing idle. The invention exploits this recognition by using the scan chain's test cells to store the breakpoint conditions. A small additional amount of logic is then needed to compare the stored breakpoint conditions with those currently present within the integrated circuit and generate an appropriate control (e.g. interrupt) signal to be fed to the integrated circuit itself. In this way, the test cells may be re-used for their storage capability during normal system operation as well as during test operation and relatively little additional area within the integrated circuit needs to be used to provide this extra function. Measures which reduce the area required by an integrated circuit are highly advantageous since physically smaller integrated circuits can be more efficiently and less expensively produced.

The test cells are operable in a test mode that exchanges data with a point in the integrated circuit. This exchange could be to write to the point or to read from the point. However, in preferred embodiments, both functions are supported such that in said test mode said test cell is operable to apply a signal value to said point and to capture a signal value from said point.

It will be appreciated that whilst a single means for logically combining could be provided to generate a control signal in dependence upon a simple single signal value condition, the invention will generally be more advantageously employed in situations having a plurality of said means for logically combining each generating a control signal.

When the conditions that are being looked for are more complex, more data needs to be stored within the test cells and so the re-use of the storage capacity of the test cells is comparatively more favourable.

Whilst it would be appreciated that the control that is exercised upon the integrated circuit may take any form, it is most usual that an exception signal fop the integrated circuit should be generated.

The logical operations that can be performed upon the signal values from respective points within the integrated circuit and the signal values stored within the test cells may be chosen from the usual range of such logical operations (e.g. OR, AND, XOR, etc). However, the invention is particularly suited to uses in which each means for logically combining operates to generate a control signal indicative of whether said signal value stored within said test cell equals said signal value generated by said integrated circuit.

The invention is particularly suited to embodiments in which said plurality of means for logically combining and corresponding test cells are coupled to points on bit lines of an address bus, said exception signal being generated when an address on said address bus matches an address stored within said test cells during said operation mode.

Looking for a match in an address bus value, which might be 32 or 64 bits in length, would be difficult to conveniently perform in the absence of the invention and yet is highly useful in providing debugging breakpoints and even in uses such as memory mapping control.

It will be appreciated that the invention may be utilised in integrated circuits of many different forms, but is particularly suited for use in integrated circuits that serve as central processing units within computing systems.

Viewed from another aspect the invention provides a method of operating an integrated circuit, said method comprising the steps of:

(i) serially transferring signal values through a plurality of serially connected test cells and exchanging a signal value with a respective point within said integrated circuit to which said test cell is coupled; and (ii) logically combining at least one signal value stored within a test cell with a signal value generated by said integrated circuit at said point coupled to said test cell to generate a control signal for controlling operation of said integrated circuit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
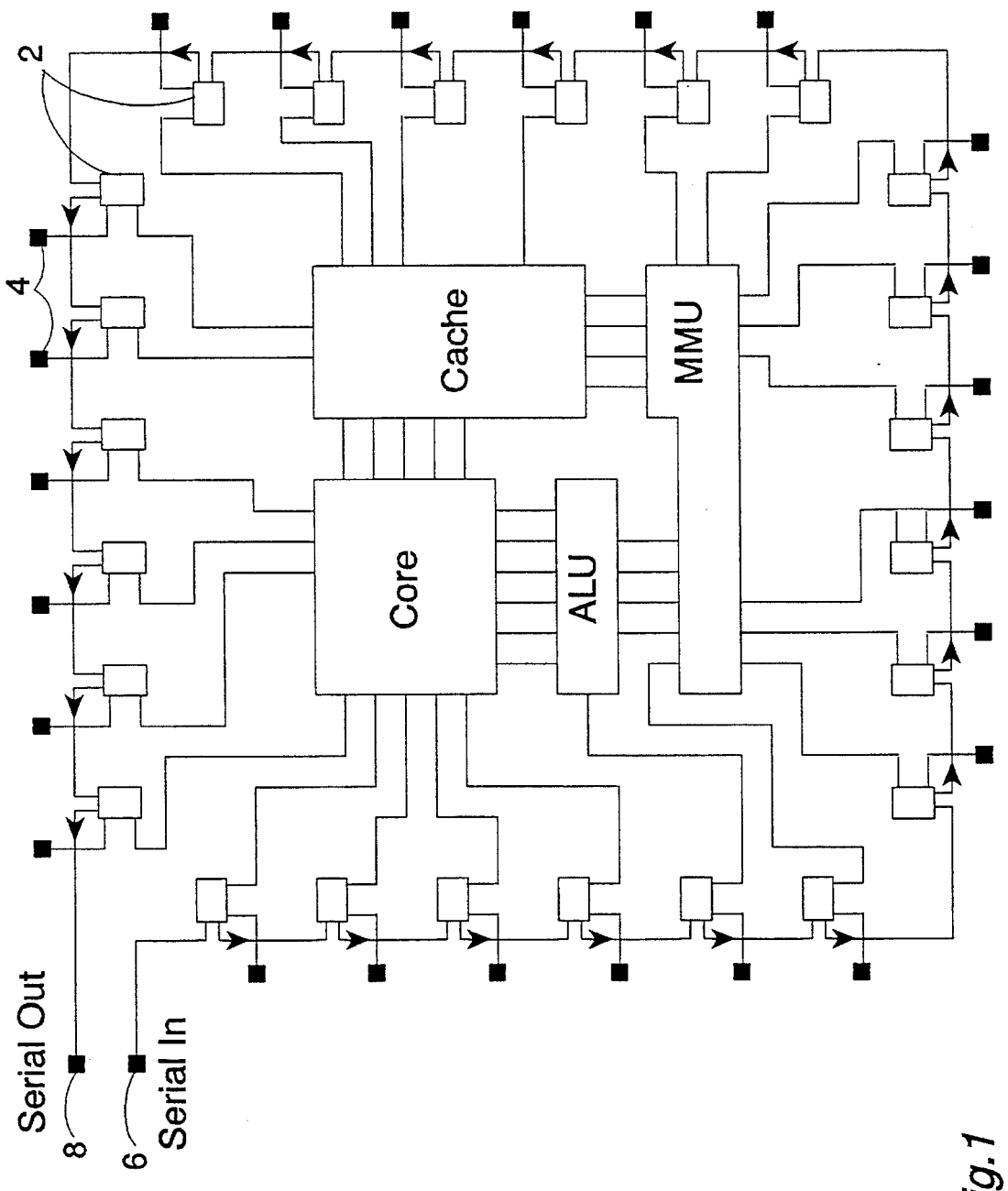
FIG. 1 illustrates an integrated circuit having a boundary scan style chain around its periphery.
Figure 2:
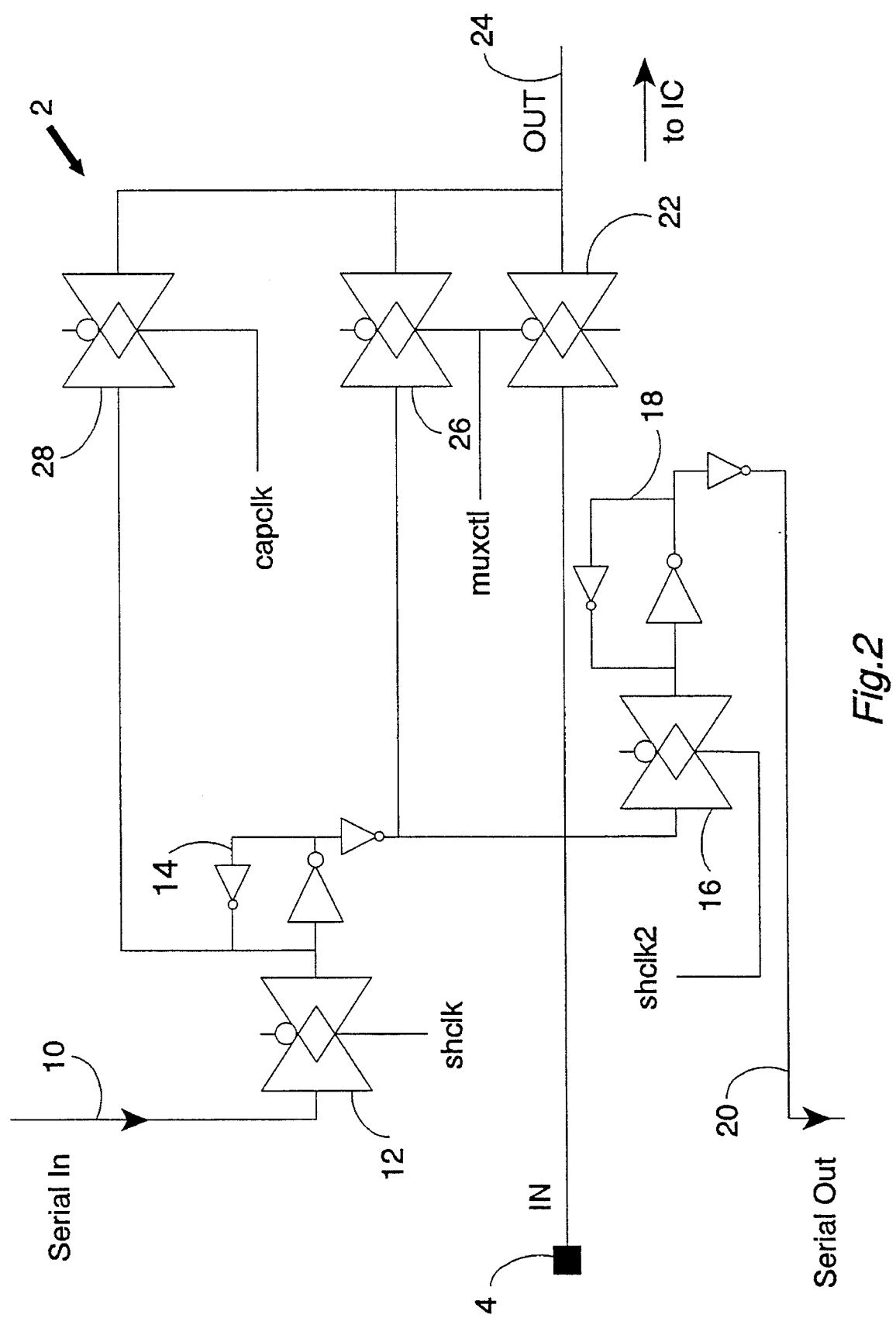
FIG. 2 illustrates a test cell within a boundary scan chain.
Figure 3:
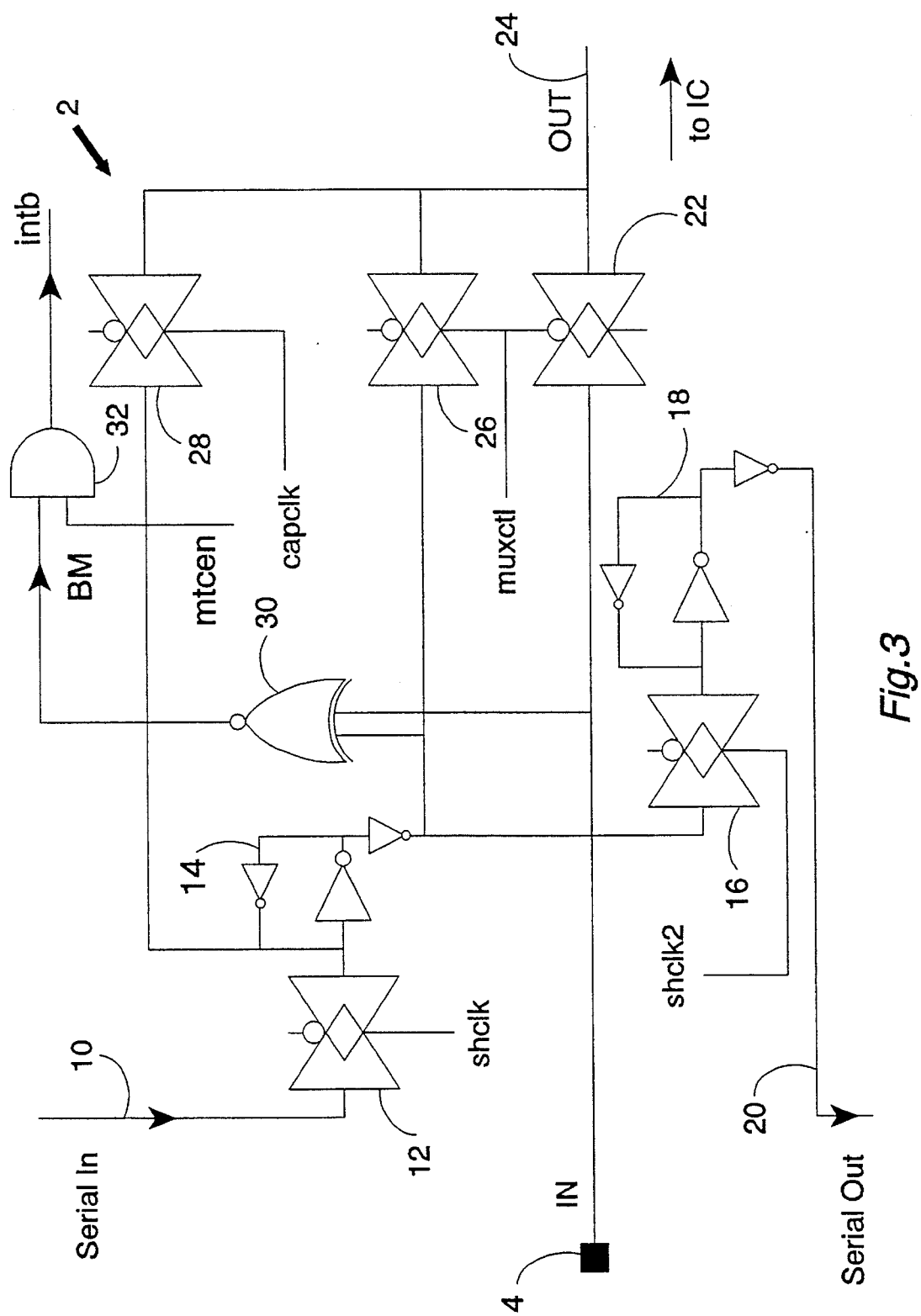
FIG. 3 illustrates a modified test cell having means for logically combining a stored signal value with a signal value generated within the integrated circuit.

FIG. 3 illustrates the test cell 2 of FIG. 2 modified to include a means for logically combining in the form of a NXOR gate 30. The NXOR gate 30 takes one input from between the first latch 14 and the output transmission gate 16. The other input to the NXOR gate 30 is taken from a point within the integrated circuit via the main path transmission gate 22. If both inputs to the NXOR gate 30 are the same, then its output is "1". If the inputs to the NXOR gate 30 are different, then its output is "0". The other modification to the test cell 2 is the addition of an AND gate 32. The AND gate 32 serves to either pass or block the output of the NXOR gate 30 in dependence upon whether a mtcen signal fed to one of its input indicates that the matching function is enabled for this test cell 2. The output from the AND gate 32 is an interrupt bit signal intb that is passed into the integrated circuit for further processing prior to giving rise to an interrupt or controlling the operation of the integrated circuit in some other way.

Figure 4:
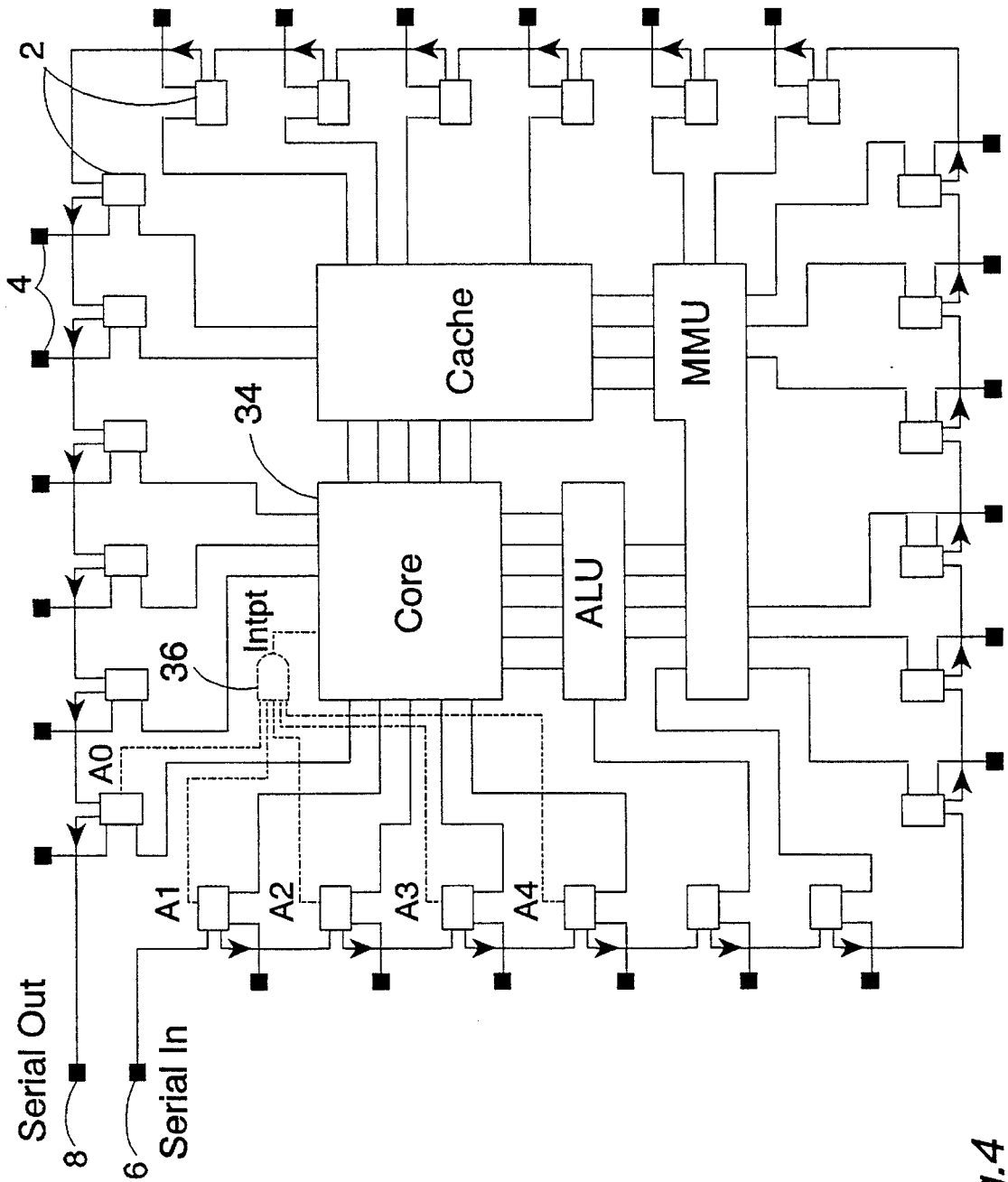
FIG. 4 illustrates an integrated circuit having a plurality of test cells as illustrated in FIG. 3 serving to generate an exception signal.

FIG. 4 illustrates five test cells 2, such as that illustrated in FIG. 3, associated with five address bus lines A0 to A4 from an integrated circuit core 34. The test cells 2 for these address bus lines are serially loaded with data corresponding to a predetermined address. The intb outputs from each of the test cells are fed to the inputs of a five-input AND gate 36 where they are combined to yield an interrupt signal (a type of exception signal) Intpt that is supplied to the core 34. If all of the bits are the address being asserted by the core 34 match the data stored within the test cells, then an interrupt is produced. It will be appreciated that the AND gates 32 associated with each of the test cells 2 could be replaced by providing the AND gate 36 with an additional input comprising the mtcen signal thereby using the AND gate 36 to gate all of the signals in one operation.

Such an arrangement as illustrated in FIG. 4 may be used to set breakpoints within software being executed by the integrated circuit in the form of a central processing unit such that in a debugging process the software execution may be halted at a predetermined controlled position for analysis of variables at that point.

Figure 5:
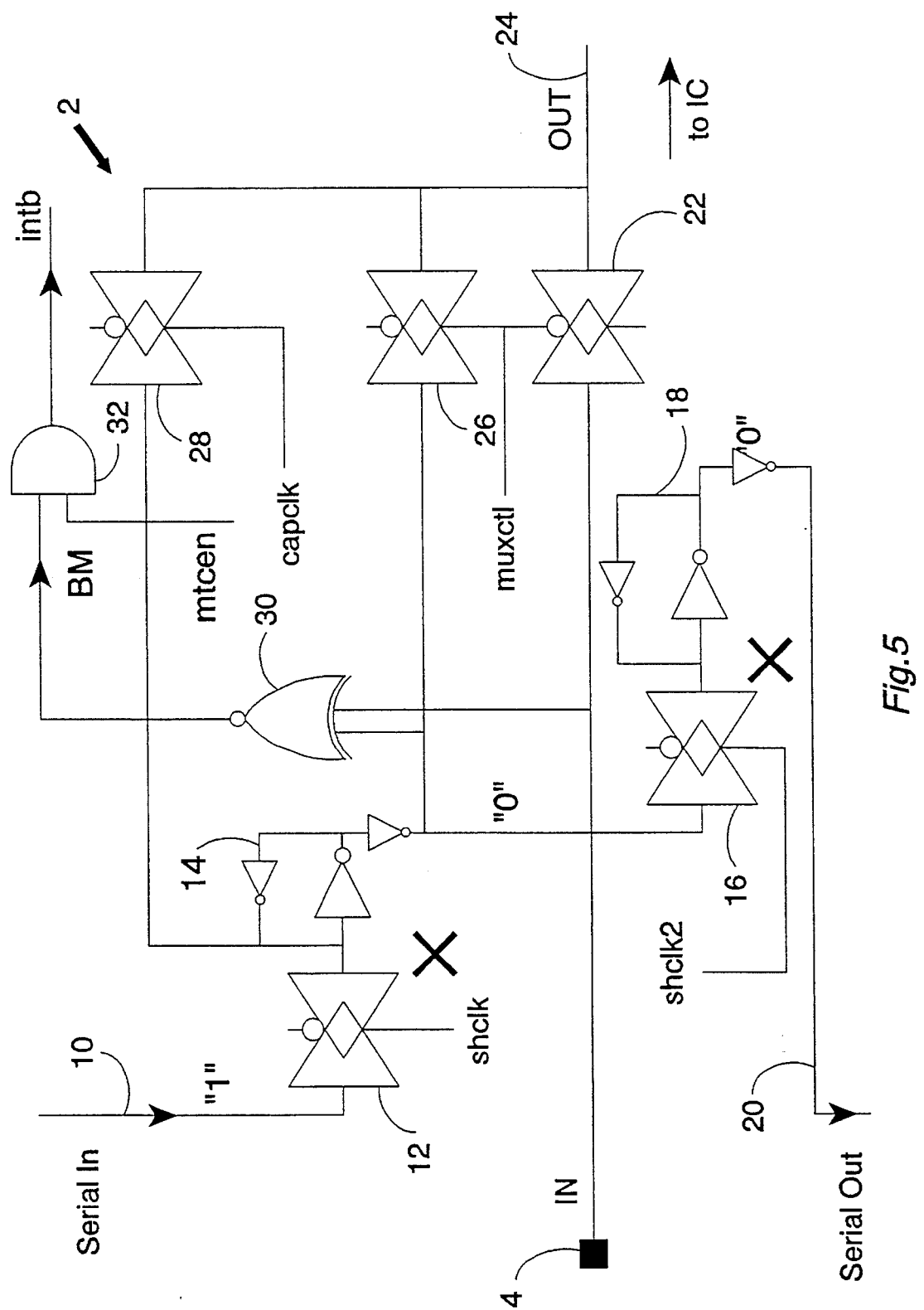
FIGS. 5 to 8 illustrate the serial loading and unloading of data from a test cell.

FIGS. 5, 6, 7 and 8 illustrate the serial loading/unloading of data from the scan chains. As illustrated in FIG. 5 both the input transmission gate 12 and the output transmission gate 16 are switched off and blocking the passage of signal values. The input signal value to the test cell 2 is a "1". The output signal value that is stored within the test cell 2 and is currently being asserted at its output is "0".

Figure 6:
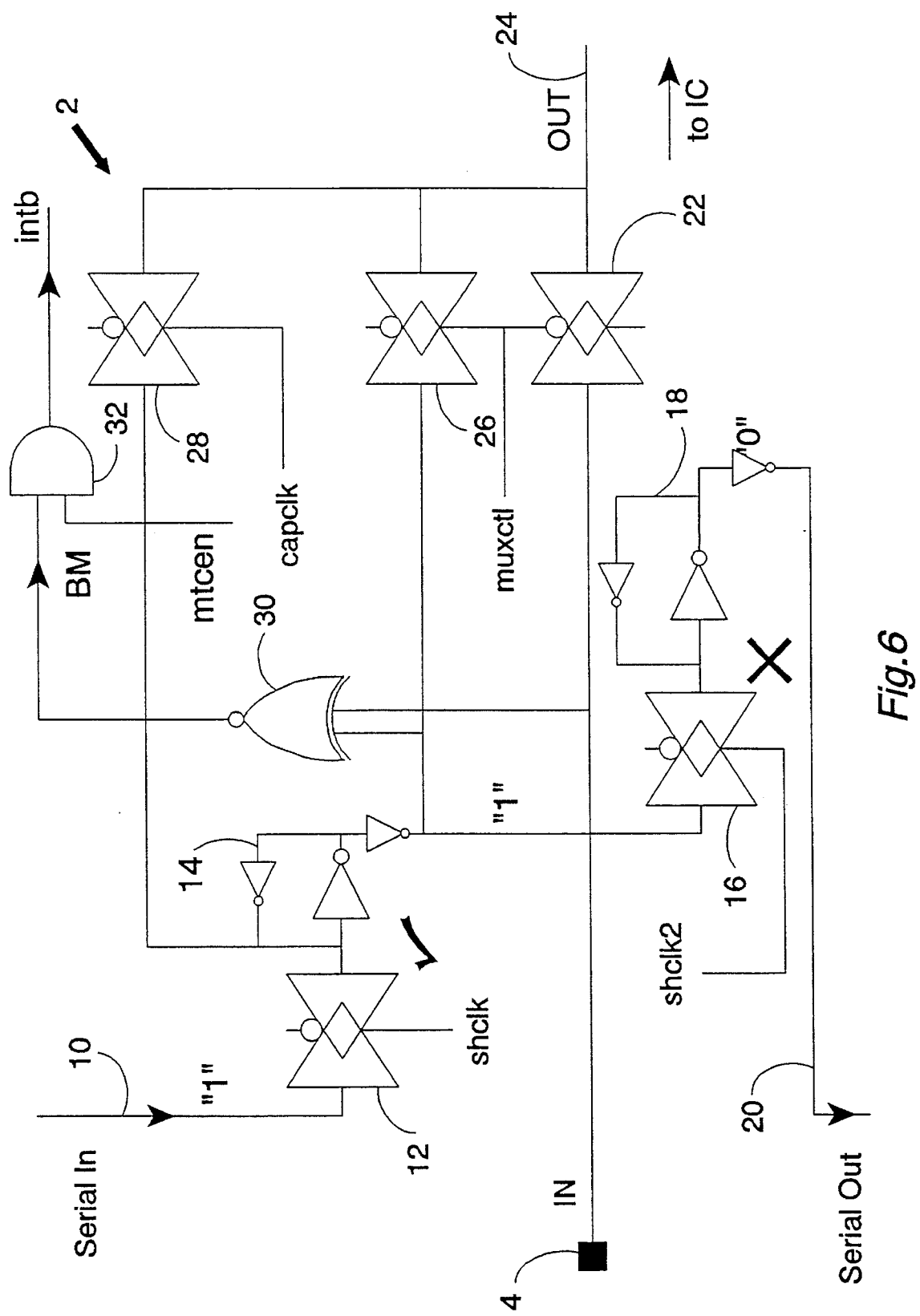

As shown in FIG. 6, the first action to occur is that the shclk signal to the input transmission gate 12 enables that gate and allows the signal value "1" to propagate to the first latch 14 where it replaces the previously stored signal value of "0". Meanwhile, the output transmission gate 16 remains non-conductive and so the second latch 18 continues to hold and assert on the output from the test cell 2 a signal value "0". This is important since the next test cell in the scan chain will be currently loading that signal value of "0" into its respective first latch 14.

Figure 7:
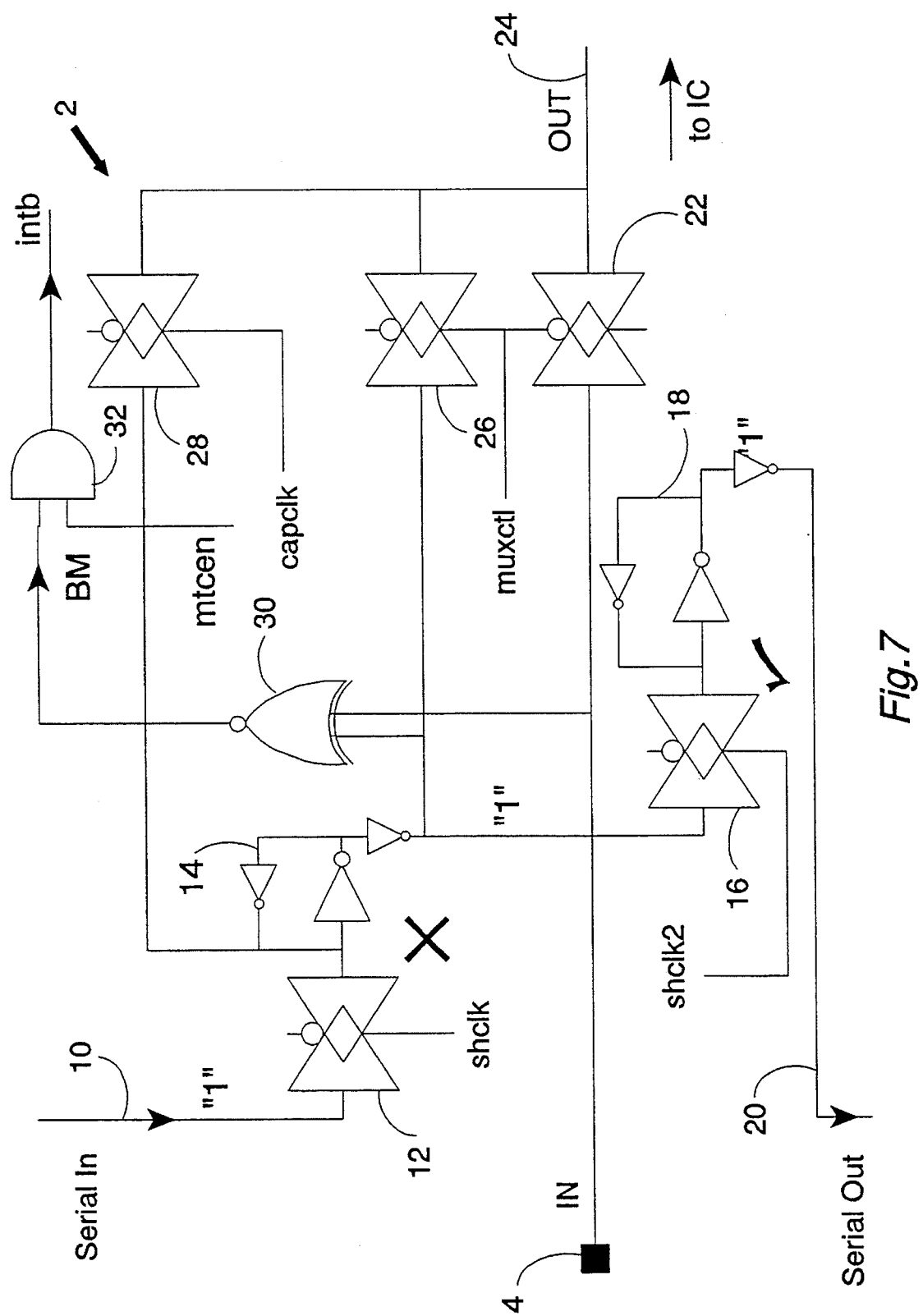

FIG. 7 shows that the shclk signal has rendered the input transmission gate 12 non-conductive whilst the shclk2 signal has rendered the output transmission gate 16 conductive. Thus, the signal value stored by the first latch 14 during the time period illustrated in FIG. 6 is transferred to the second latch 18, whilst the first latch 14 is made insensitive to changes at the serial input to the test cell 2. The shc1k and shclk2 are generated by a non-overlapping clock signal generator to avoid the possibility of signal breakthrough at the change over.

Figure 8:
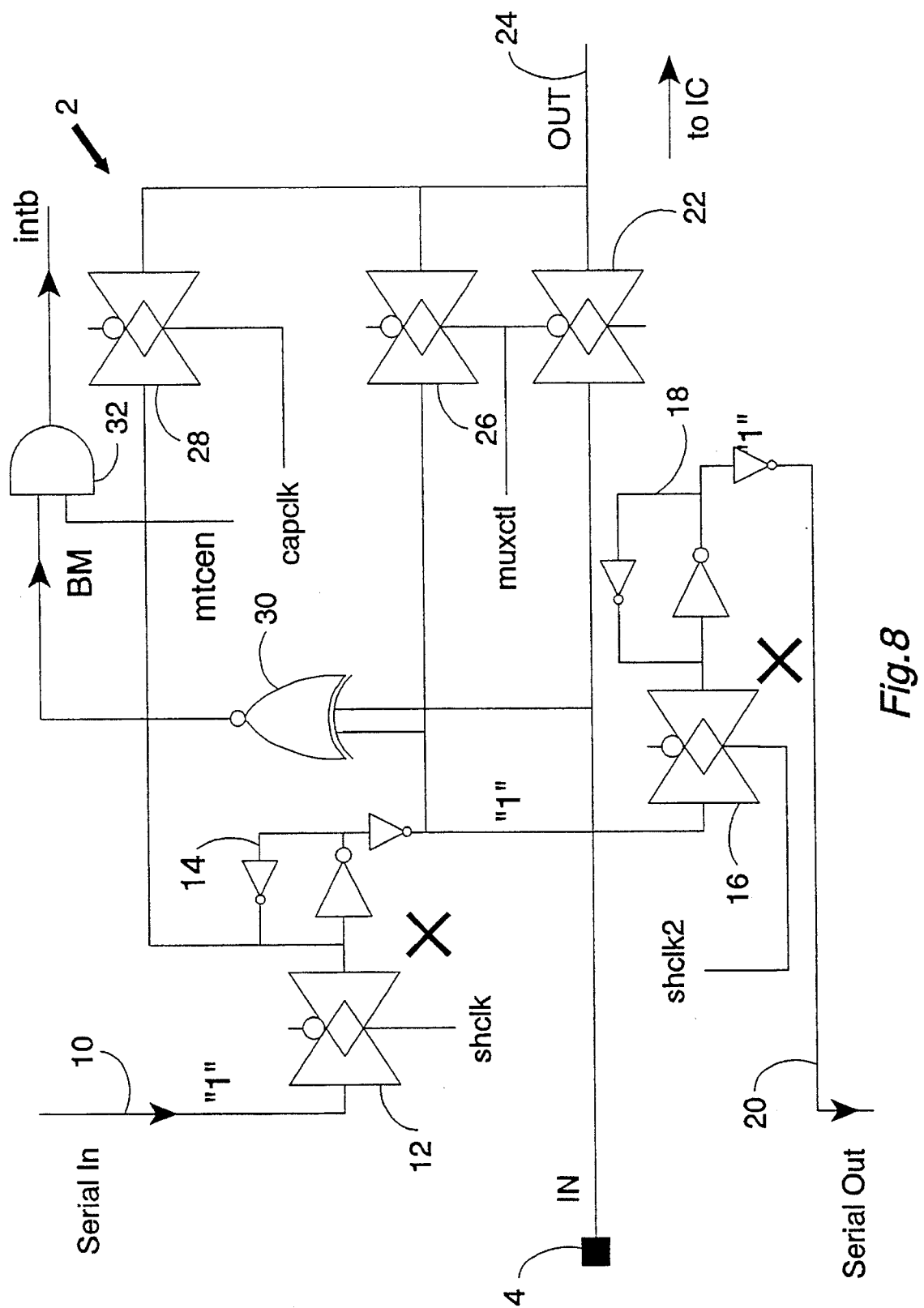

FIG. 8 shows the final state in which both the input transmission gate 12 and the output transmission gate 16 are again non-conductive with the new signal value of "1" being asserted by the first latch 14 and the second latch 18.

Figure 9:
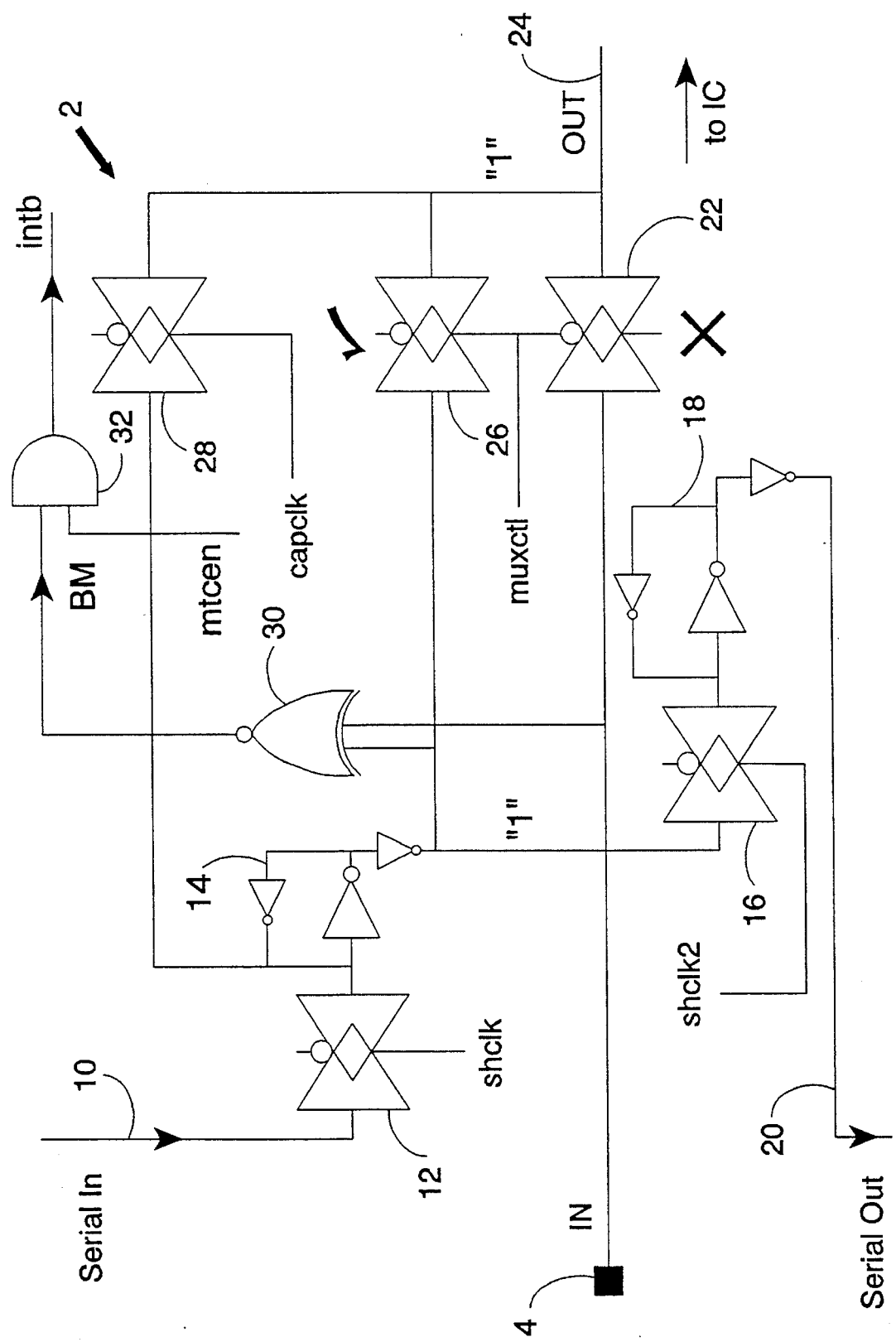
FIG. 9 illustrates the operation of a test cell in applying a stored signal value to an integrated circuit.

FIG. 9 illustrates the test cell 2 serving to stimulate the integrated circuit by applying to it a signal value stored within the test cell 2. In this case, the stimulate transmission gate 26 is rendered conductive whilst the main path transmission gate 22 is blocked. In this way, the output of the first latch 14 is passed to the integrated circuit via the stimulate transmission gate 26.

Figure 10:
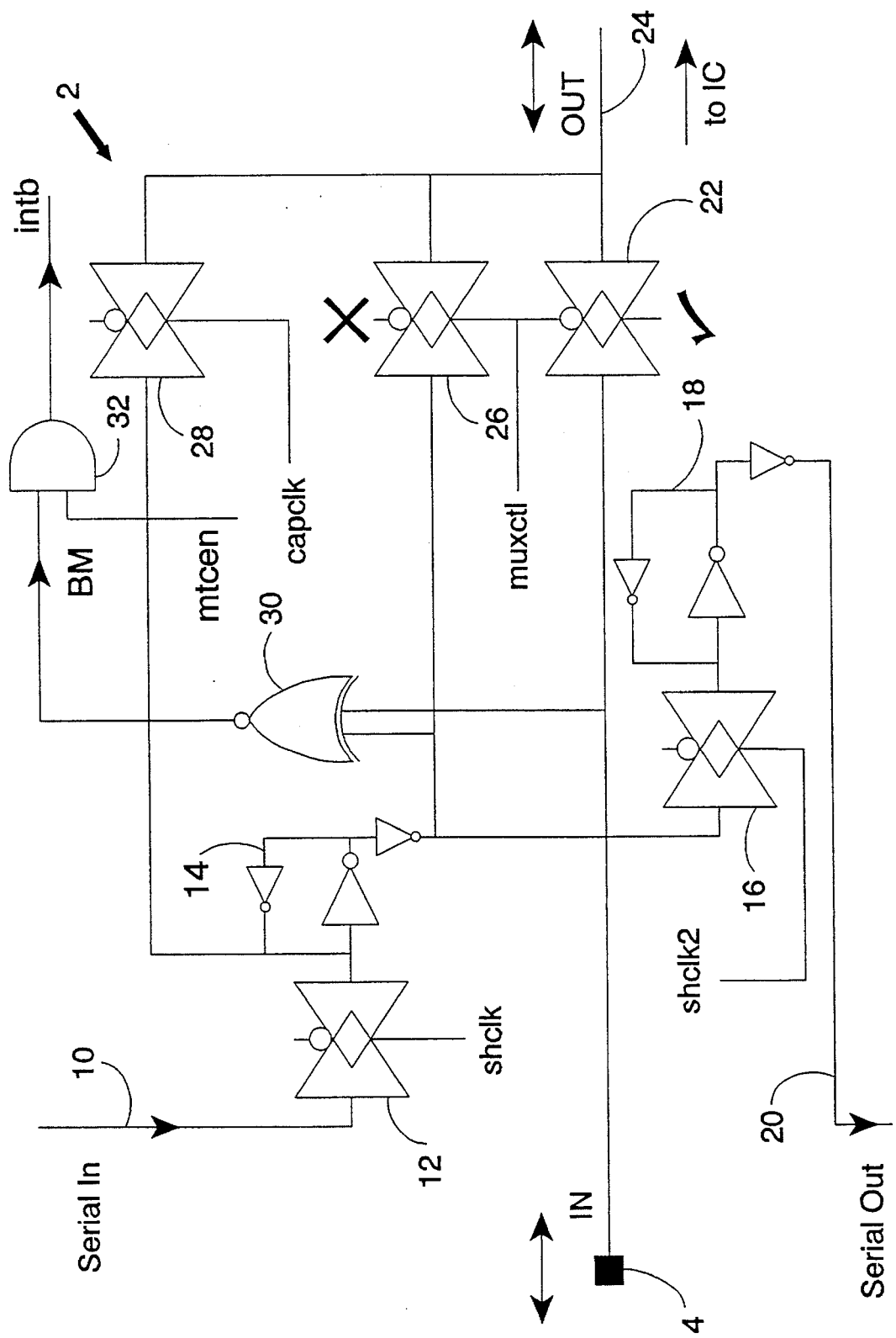
FIG. 10 illustrates the test cell being bypassed in system operation.

FIG. 10 illustrates the test cell 2 during normal operation of the integrated circuit in which the test cell 2 is bypassed. In this case, the main path transmission gate 22 is conductive and all of the remaining transmission gates are non conductive. Thus, signal values propagate into and out of the integrated circuit to the contact pad 4 via the main path transmission gate 22.

Figure 11:
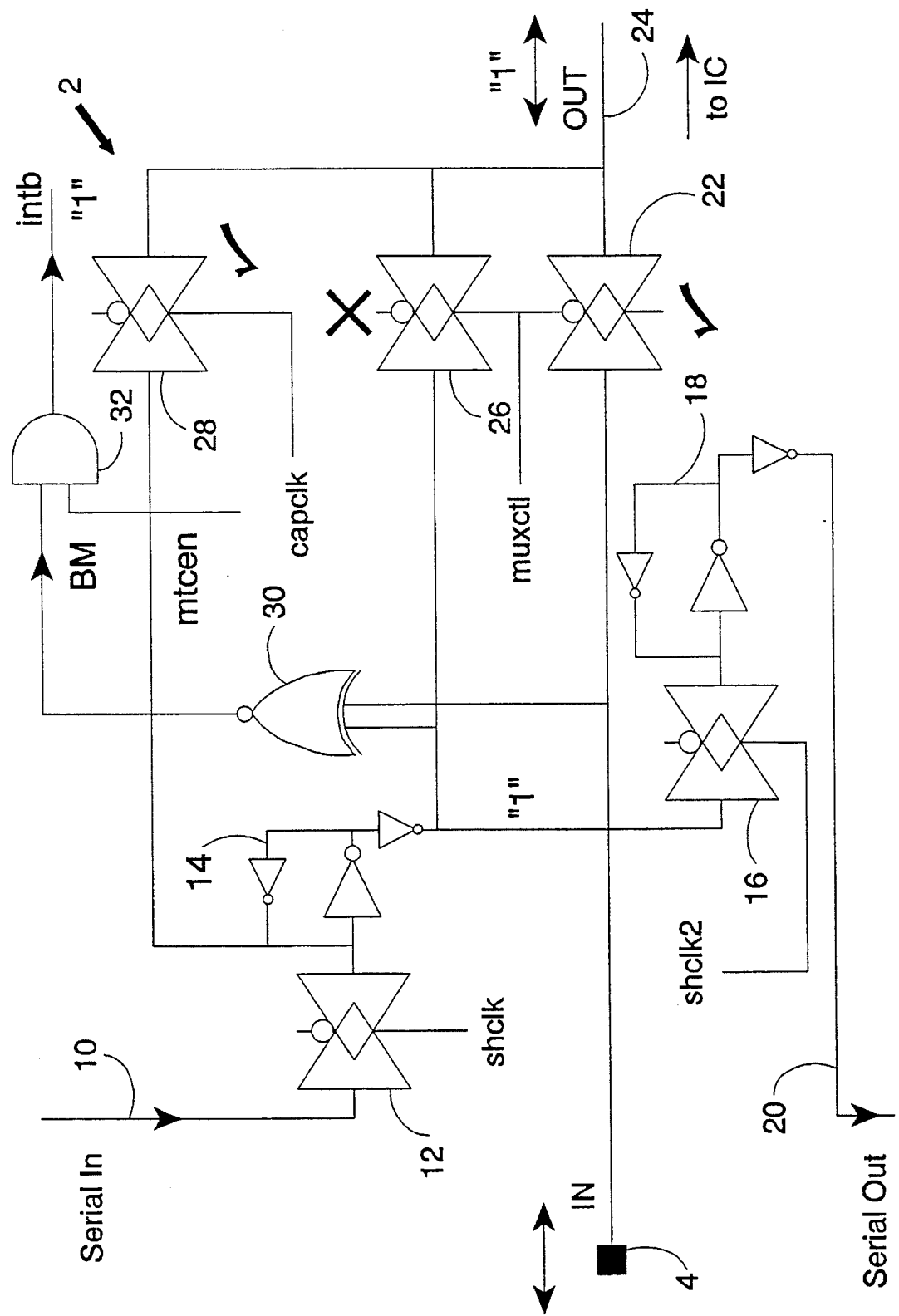
FIG. 11 illustrates the test cell capturing a signal being generated within the integrated circuit.

FIG. 11 illustrates the operation of the test cell 2 to capture signal values from within the integrated circuit. In this case, the capture transmission gate 28 is enabled by the capclk signal. This passes the signal value (e.g. "1") to the input of the first latch 14 where it overwrites any existing signal values stored by the first latch by overcoming the action of the weak feedback. When the capclk signal is removed the capture transmission gate 28 returns to a non-conductive state whereby the captured signal value is no longer changed by any changes within the integrated circuit.

Figure 12:
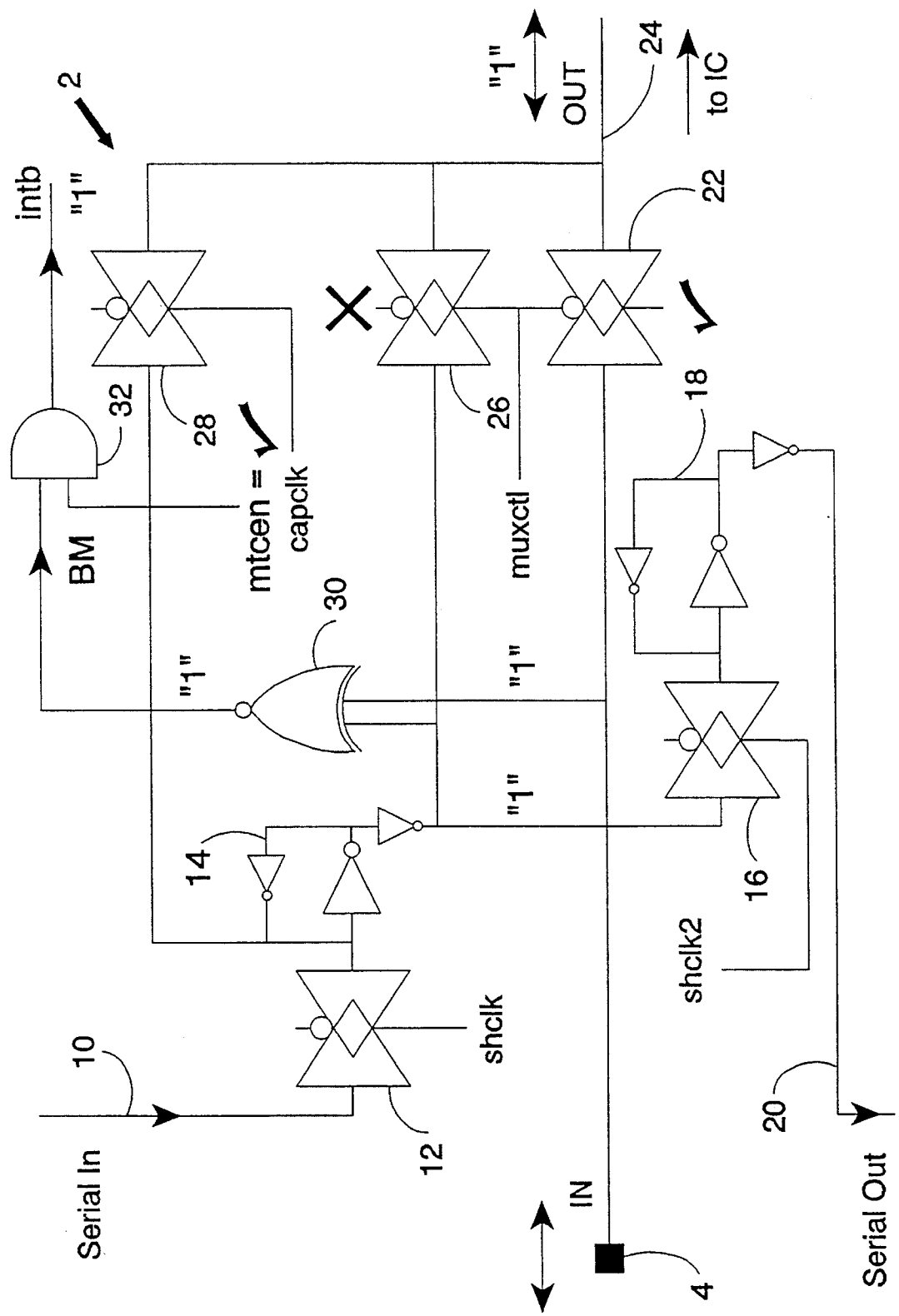
FIGS. 12 and 13 illustrate the test cell comparing a signal value generated from a point within the integrated circuit with a stored signal value.
Figure 13:
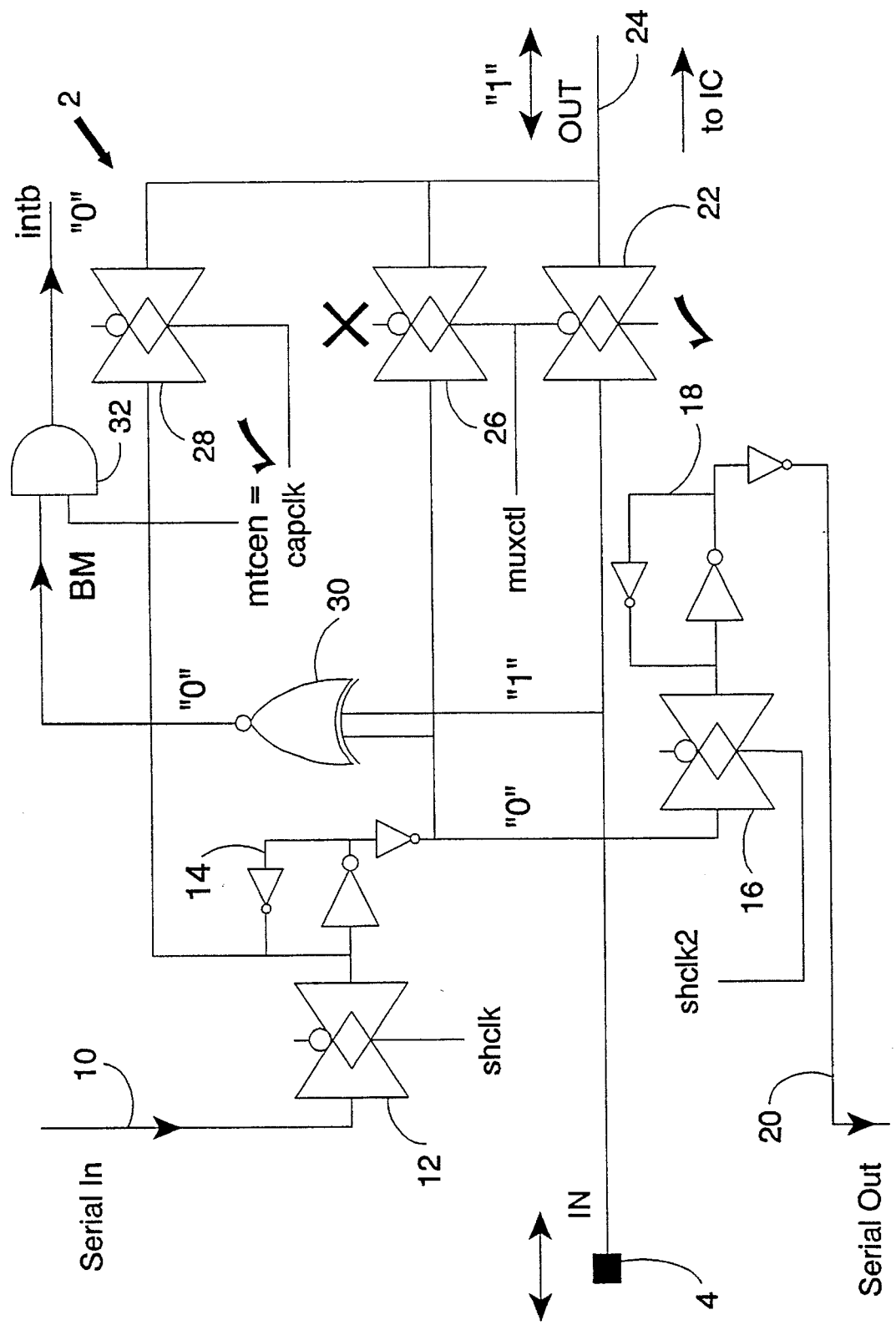

FIGS. 12 and 13 illustrate the operation of the test cell 2 serving to compare a stored signal value with an actual signal value being applied to the integrated circuit. In this mode of operation, the mtcen signal is enabled allowing the AND gate 32 to pass the bit match signal BM output from the NXOR gate 30. In the case of FIG. 12, the signal value stored by the first latch 14 is a "1" and the signal value currently being generated by the integrated circuit and passed by the main path transmission gate 22 is also a "1". In this case, the NXOR gate produces a value of "1" at its output that is passed by the AND gate 32 to indicate that bit match has occurred.

In contrast, in FIG. 13, the stored value in the first latch 14 is a "0" and a match is not present. Thus, the NXOR gate 30 produces a "0" at its output that is again passed by the AND gate 32.

FIGS. 12 and 13 illustrate the test cell 2 used at a dedicated input pad. In the case of a test cell 2 used at a dedicated output pad, it is required to apply data serially loaded into the cell to the output pad to simulate s signal that should be being produced by the integrated circuit and applied to the outside. The circuit required to do this is essentially the same as that shown in FIGS. 12 and 13, with the output line 24 now being connected to an output pad and the pad 4 being connected to the integrated circuit. In the case of a signal line that operates bidirectionally (e.g. a data bus line) two test cells may be provided, one for input and one for output, or a modified test cell able to perform both functions.

Figure 14:
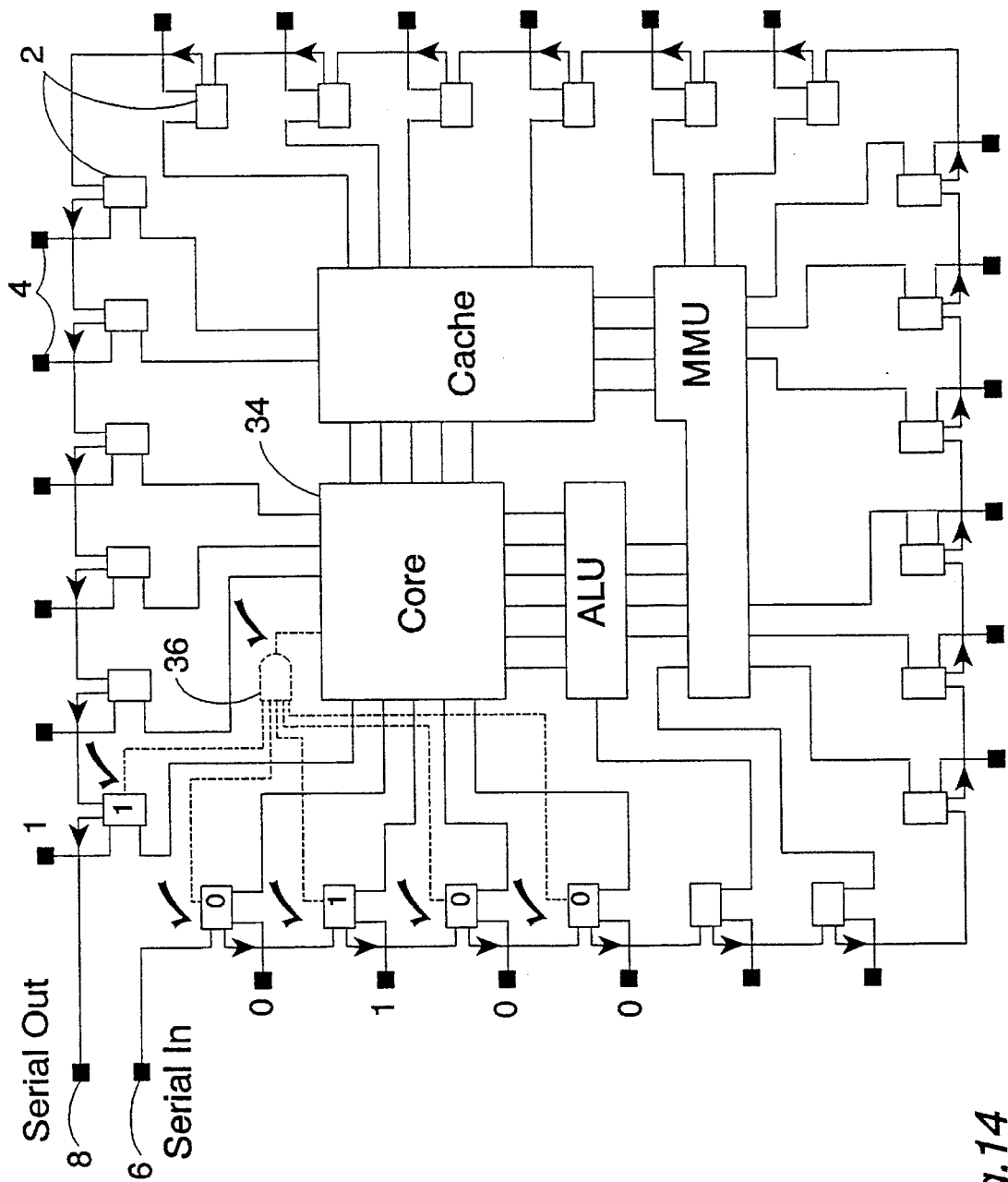
FIG. 14 illustrates a plurality of test cells operating in accordance with FIGS. 12 and 13.

FIG. 14 shows how if all the signals on the address bus (all output signal lines requiring the modified versions of the test cells shown in FIGS. 12 and 13 as discussed above) match the stored signals then an interrupt is generated. More particularly, going from the low order bit A0 to the high order bit A4, the test cells store the data "10100". As indicated, the processor core 34 is driving the output address bus with exactly this same bit pattern of "10100" and accordingly all five test cells generate an intb signal that is high. The five-input AND gate 36 detects this and generates a high interrupt signal Intpt that is fed to the core 34 to interrupt its operation and divert processing to an interrupt vector.

It will be appreciated that this example of an address bus and an interrupt is only one possibility for the nature of the logical combination and control that may be provided in dependence upon the signal value stored within the test cells during normal operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for processing data, wherein said apparatus has a hardware test mode and a system mode of non-hardware testing operation, said apparatus comprising:

(i) an integrated circuit;

(ii) a plurality of serially connected test cells, each test cell being coupled to a respective point within said integrated circuit and being operable in said hardware test mode to exchange a signal value with said point, and at least one of said test cells being operable to store a predetermined constant signal value at least partially defining an exception condition during said system mode;

(iii) a plurality of transmission devices for serially transferring signal values through said plurality of test cells; and (iv) a first circuit for logically combining said predetermined signal value stored within said at least one of said test cells with a signal value generated by said integrated circuit at a point coupled to said at least one of said test cells to detect said exception condition and to generate an exception signal for triggering exception processing operation of said integrated circuit while remaining in said system mode.

2. Apparatus as claimed in claim 1, wherein in said test mode said test cell is operable to apply a signal value to said point and to capture a signal value from said point.

3. Apparatus as claimed in claim 1, comprising a plurality of said first circuits.

4. Apparatus as claimed in claim 3, comprising a second circuit for combining signals from said plurality of first circuits to generate said exception signal.

5. Apparatus as claimed in claim 4, wherein each of the plurality of first circuits operates to generate a signal indicative of whether said predetermined signal value stored within said test cell equals said signal value generated by said integrated circuit.

6. Apparatus as claimed in claim 3, wherein said plurality of first circuits and corresponding test cells are coupled to points on bit lines of an address bus, said exception signal being generated when an address on said address bus matches an address stored within said test cells during said operation mode.

7. Apparatus as claimed in claim 1, wherein said integrated circuit comprises a central processing unit.

8. A method of operating an integrated circuit having a plurality of serially corrected test cells, said method comprising the steps of:

(i) during a test mode of operation, serially transferring signal values through said test cells and exchanging said signal values with said integrated circuit at respective points on said integrated circuit to which said test cells are coupled; and (ii) during a system mode of non-hardware-testing operation, logically combining a predetermined constant signal value at least partially defining an exception condition and stored within at least one of said test cells with a signal value generated by said integrated circuit at a point coupled to said at least one of said test cells to detect said exception condition and to generate an exception signal for triggering exception processing operation of said integrated circuit while remaining in said system mode.

9. An apparatus for processing data, wherein the apparatus has a hardware test mode and a system mode of non-hardware testing operation, the apparatus comprising:

an integrated circuit;

a test cell coupled to the integrated circuit, for exchanging a signal value with the integrated circuit in response to the apparatus being in the test mode and for storing a predetermined constant signal value at least partially defining an exception condition and in response to the apparatus being in the system mode; and a first circuit disposed within the test cell for, in response to the apparatus being in the system mode, logically combining the predetermined signal value with a signal value generated by the integrated circuit to detect said exception condition and to generate an exception signal for triggering exception processing operation of the integrated circuit.

10. The apparatus of claim 9, wherein the apparatus comprises a plurality of test cells and wherein the apparatus includes a second circuit for combining signals from the plurality of test cells to generate the exception signal.

* * * * *